United States Patent
Nguyen et al.

(10) Patent No.: US 8,013,417 B2
(45) Date of Patent: Sep. 6, 2011

(54) LOW COST SUBSTRATES AND METHOD OF FORMING SUCH SUBSTRATES

(75) Inventors: Bich-Yen Nguyen, Austin, TX (US); Carlos Mazure, Bernin (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 189 days.

(21) Appl. No.: 12/469,436

(22) Filed: May 20, 2009

(65) Prior Publication Data

US 2009/0321872 A1   Dec. 31, 2009

Related U.S. Application Data

(60) Provisional application No. 61/098,877, filed on Sep. 3, 2008.

(30) Foreign Application Priority Data

Jun. 30, 2008 (FR) ...................................... 08 03701

(51) Int. Cl.
 *H01L 21/70* (2006.01)
(52) U.S. Cl. ........ 257/506; 257/309; 257/334; 257/347; 257/610
(58) Field of Classification Search .................. None
 See application file for complete search history.

(56) References Cited

U.S. PATENT DOCUMENTS

| | | | |
|---|---|---|---|
| 4,300,150 A | 11/1981 | Colak | 357/23 |
| 4,771,016 A | 9/1988 | Bajor et al. | 438/455 |
| 5,399,507 A | 3/1995 | Sun | 437/24 |
| 5,750,000 A | 5/1998 | Yonehara et al. | 156/630.1 |
| 5,773,151 A | 6/1998 | Begley et al. | 428/446 |
| 6,063,713 A * | 5/2000 | Doan | 438/763 |
| 6,140,163 A | 10/2000 | Gardner et al. | 438/157 |
| 6,166,411 A | 12/2000 | Buynoski | 257/347 |
| 6,221,732 B1 | 4/2001 | Kaneko | 438/405 |
| 6,391,744 B1 | 5/2002 | Hudak et al. | 438/459 |

(Continued)

FOREIGN PATENT DOCUMENTS

DE   42 32 844 A1   3/1994

(Continued)

OTHER PUBLICATIONS

Disney, "SOI Smart IGBT with Low Cost and High Performance," IEEE International Symposium on Power Semiconductor Devices and IC's, May 1997, pp. 289-292.

(Continued)

*Primary Examiner* — N Drew Richards
*Assistant Examiner* — Kyoung Lee
(74) *Attorney, Agent, or Firm* — Winston & Strawn LLP

(57) ABSTRACT

In one embodiment, the invention provides engineered substrates having a support with surface pits, an intermediate layer of amorphous material arranged on the surface of the support so as to at least partially fill the surface pits, and a top layer arranged on the intermediate layer. The invention also provides methods for manufacturing the engineered substrates which deposit an intermediate layer on a pitted surface of a support so as to at least partially fill the surface pits, then anneal the intermediate layer, then assemble a donor substrate with the annealed intermediate layer to form an intermediate structure, and finally reduce the thickness of the donor substrate portion of the intermediate structure in order to form the engineered substrate.

19 Claims, 4 Drawing Sheets

U.S. PATENT DOCUMENTS

| | | | |
|---|---|---|---|
| 6,538,916 B2 | 3/2003 | Ohsawa | 365/149 |
| 6,645,795 B2 | 11/2003 | Muller et al. | 438/149 |
| 6,646,307 B1 | 11/2003 | Yu et al. | 257/347 |
| 6,664,598 B1 | 12/2003 | Dennard et al. | 257/347 |
| 6,812,527 B2 | 11/2004 | Dennard et al. | 257/347 |
| 6,815,296 B2 | 11/2004 | Dennard et al. | 438/283 |
| 6,826,320 B2 | 11/2004 | Deliwala | 385/14 |
| 6,946,373 B2 | 9/2005 | Agnello et al. | 438/509 |
| 6,955,971 B2 | 10/2005 | Ghyselen et al. | 438/406 |
| 7,018,873 B2 | 3/2006 | Dennard et al. | 438/149 |
| 7,089,515 B2 | 8/2006 | Hanafi et al. | 716/4 |
| 7,102,206 B2 | 9/2006 | Hidaka et al. | 257/618 |
| 7,221,038 B2 * | 5/2007 | Auberton-Herve | 257/618 |
| 7,273,785 B2 | 9/2007 | Dennard et al. | 438/262 |
| 7,358,166 B2 | 4/2008 | Agnello et al. | 438/509 |
| 7,387,946 B2 | 6/2008 | Dao | 438/458 |
| 7,417,288 B2 | 8/2008 | Dennard et al. | 257/365 |
| 7,422,958 B2 | 9/2008 | Kostrzewa et al. | 438/406 |
| 7,883,990 B2 | 2/2011 | Levy et al. | 438/459 |
| 2002/0170487 A1 * | 11/2002 | Zehavi et al. | 117/84 |
| 2003/0039439 A1 | 2/2003 | Deliwela | 385/30 |
| 2003/0057487 A1 | 3/2003 | Yamada et al. | 257/347 |
| 2004/0079993 A1 | 4/2004 | Ning et al. | 257/347 |
| 2004/0150067 A1 | 8/2004 | Ghyselen et al. | 257/506 |
| 2004/0171232 A1 | 9/2004 | Cayrefourcq et al. | 438/458 |
| 2004/0256700 A1 | 12/2004 | Doris et al. | 257/627 |
| 2005/0112845 A1 | 5/2005 | Ghyselen et al. | 438/455 |
| 2005/0205930 A1 | 9/2005 | Williams | 257/347 |
| 2006/0016387 A1 | 1/2006 | Yokoyama et al. | 117/84 |
| 2006/0125013 A1 | 6/2006 | Rim | 257/351 |
| 2006/0154442 A1 | 7/2006 | de Souza et al. | 438/455 |
| 2006/0166451 A1 | 7/2006 | Raskin et al. | 438/311 |
| 2006/0264004 A1 | 11/2006 | Tong et al. | 438/455 |
| 2006/0276004 A1 | 12/2006 | Dao | 438/455 |
| 2007/0032040 A1 | 2/2007 | Lederer | 438/455 |
| 2007/0138558 A1 | 6/2007 | Saitoh | 257/350 |
| 2007/0190681 A1 | 8/2007 | Lee et al. | 438/54 |
| 2008/0029815 A1 | 2/2008 | Chen et al. | 257/347 |
| 2008/0054352 A1 | 3/2008 | Imoto et al. | 257/330 |
| 2008/0079123 A1 | 4/2008 | Kostrzewa et al. | 257/635 |
| 2008/0105925 A1 | 5/2008 | Pae et al. | 257/347 |
| 2008/0124847 A1 | 5/2008 | Sudo | 438/152 |
| 2008/0153313 A1 | 6/2008 | Kononchuk | 438/795 |
| 2010/0127345 A1 | 5/2010 | Sanders et al. | 257/528 |

FOREIGN PATENT DOCUMENTS

| | | | |
|---|---|---|---|
| FR | 2 906 078 A | | 3/2008 |
| FR | 2 910 702 A | | 6/2008 |
| JP | 08124827 | | 5/1996 |
| WO | WO 2004/100268 A1 | | 11/2004 |
| WO | WO 2005/031842 A1 | | 4/2005 |

OTHER PUBLICATIONS

Maleville et al., "Multiple SOI layers by multiple Smart Cut® transfers," IEEE International SOI Conference, Oct. 2000, pp. 134-135.

Rajkumar et al., "Effects of Nitrogen Plasma Immersion Ion Implantation in Silicon," Engineering Thin Films with Ion Beams, Nanoscale Diagnostics, and Molecular Manufacturing, Proceedings of SPIE, vol. 4468, pp. 131-139 (2001).

Yang et al., "High Performance CMOS Fabricated on Hybrid Substrate With Different Crystal Orientations," International Electron Devices Meeting, Dec. 2003, pp. 18.7.1-18.7.3.

"Controlled, Varying Depth Etching for VIA Holes and for Variable Conductor Thickness," IBM Technical Disclosure Bulletin, 31(7): 81-82 (Dec. 1988).

H. Nagano et al., XP009097417, "SOI/Bulk Hybrid Wafer Fabrication Process Using Selective Epitaxial Growth (SEG) Technique for High-End SoC Applications", Japanese Journal of Applied Physics, vol. 42, No. 4B, pp. 1882-1886 (2003).

International Search Report and Written Opinion of the International Searching Authority, application No. PCT/US2009/044810, Jan. 13, 2010.

International Search Report, and Written Opinion of the International Searching Authority, application No. PCT/US2009/044825, Jan. 13, 2010.

International Search Report, application No. PCT/US2009/044365, Jul. 16, 2009.

International Search Report, application No. PCT/US2009/044372, Jul. 10, 2009.

Search Report of French Patent Application No. 0803696 dated Feb. 23, 2009.

French Preliminary Search Report, FA 709339, FR 0803700, dated May 11, 2009.

French Preliminary Search Report, FA 709128, FR 0803676 dated Feb. 2, 2009.

Search Report of French Patent Application No. 0803697 dated Feb. 17, 2009.

Non-Final Office Action, U.S. Appl. No. 12/470,152, dated Feb. 7, 2011.

Restriction Requirement, U.S Appl. No. 12/470,253, dated Jul. 12, 2010.

Non-Final Office Action, U.S. Appl. No. 12/470,253, dated Aug. 3, 2010.

Non-Final Office Action, U.S. Appl. No. 12/470,253, dated Dec. 9, 2010.

* cited by examiner

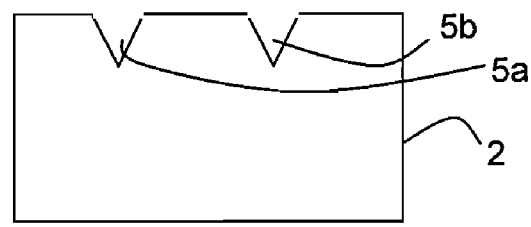
Figure 4a
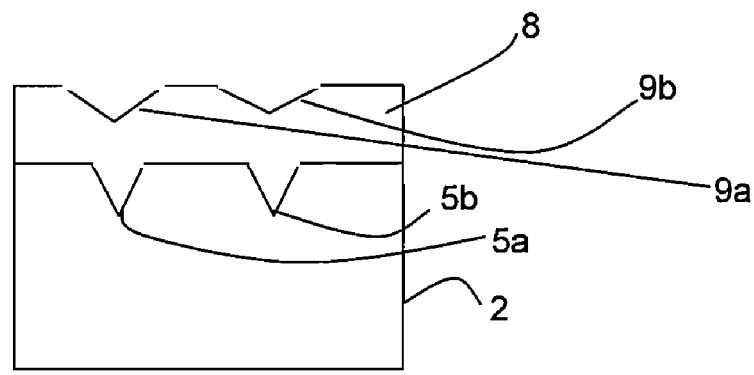
Figure 4b
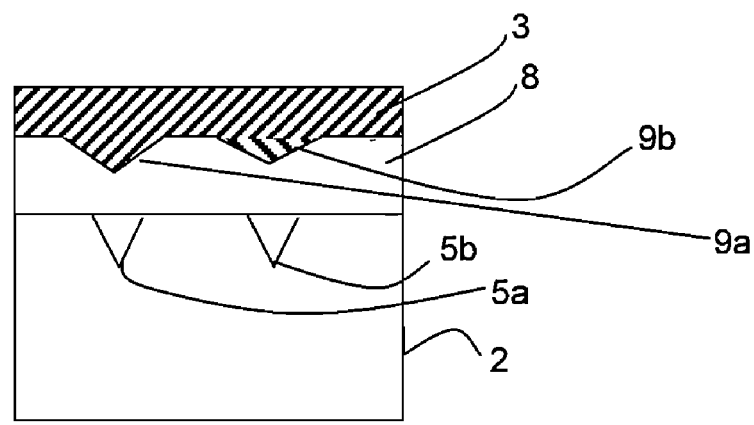
Figure 4.c

LOW COST SUBSTRATES AND METHOD OF FORMING SUCH SUBSTRATES

This application claims the benefit of U.S. application Ser. No. 61/093,877 filed Sep. 3, 2008, the entire content of which is expressly incorporated herein by reference thereto.

BACKGROUND OF THE INVENTION

The present invention relates to low cost, engineered substrates and their fabrication; such substrates find application in the fields of, e.g., microelectronics, optoelectronics, photovoltaics, micromechanics, high power microelectronics, and the like.

BACKGROUND OF THE INVENTION

Engineered substrates can be fabricated according to known techniques such as Smart Cut™ or bond and grind/etch back. Generally, a support is assembled with a donor substrate to form a temporary structure, the thickness of which is then reduced to form the final substrate. Thus, the final substrate often comprises a relatively thin top layer, the remaining thickness of thinned donor substrate, on a relatively thick support. An intermediate layer, e.g., an insulating layer, can be inserted between the top layer and the support. For example, a SOI Silicon On Insulator substrate is formed when the donor substrate and support include silicon and the intermediate layer includes silicon dioxide.

Intermediate insulating layers of significant thickness, e.g., between 200 nm to 3 microns, are common in power device applications where they serve to limit parasitic current flow (dielectric breakdown) arising from the high operating voltages. However, engineered substrates with such thick insulating layers, especially when produced by thermal oxidation of silicon, can be expensive.

Also, the costs of starting materials, i.e., the donor substrate and the support, can contribute to the expense of engineered substrates. For example, since devices are often formed in top layers of engineered substrates which usually originate from donor substrates, donor substrates are often selected to be of higher crystalline quality, and thus also of higher cost.

Lower cost starting materials for engineered substrates are known. In one approach, donor wafers from which thin layers have previously been separated according to Smart Cut™ techniques are reclaimed and reused. Smart Cut™ techniques introduce light ions into donor substrates to form planes of weakness (then, optionally, apply stiffeners to the donor substrates) and fracture the donor substrates at the planes of weakness so as to separate thin layers.

However, the crystalline quality of such reclaimed and reused donor substrates degrades, e.g., the number of defects, especially bonding defects, increases with increasing numbers of reclaims and reuses (the refresh rate). Defects that arise during bonding of a donor substrate to a support (bonding defects) appear in the final substrate as areas where the top layer has not been transferred to a support or where the top layer has been transferred but is weakly adherent. Bonding defects can be readily observed and detected by known observation tools, e.g., KLA-TENCOR SP1™ equipment.

In particular, it has been found that final substrates with a acceptable densities of bonding defects can be formed only from donor substrates that have be reclaimed and reused as a donor or support substrate no more than limited number of times, e.g., 5 or 10 times. An acceptable density of bonding defects can be, e.g., less than 1 per cm or less than 0.1 per $cm^2$, as observed by SP1.

In another approach, the starting materials for supports are initially of lower quality. Since devices are not usually formed in supports, supports do not play an active role in the substrate, and lower quality supports should not impact device performance. A lower quality support can be made from less-expensive polycrystalline materials instead of more expensive mono-crystalline materials, or from materials with greater numbers of defects such as COPs crystal originated particles or oxygen precipitates (perhaps as a result of having been grown under conditions that increase throughput at the expense of quality). COPs are generally defined as tetrahedral voids in a silicon crystal having dimensions from about 10 nm nano-meters to a few 100s of nm.

But is has further been found that bonding defects are also often observed in final substrates fabricated from lower quality supports.

Therefore, despite known cost reduction strategies, engineered substrates remain too expensive for certain applications.

SUMMARY OF THE INVENTION

The present invention provides methods for engineered substrates made from low cost supports and methods of manufacturing such engineered substrates.

It is believed that bonding defects observed when lower quality or excessively reclaimed materials are used for supports originate from surface imperfections associated with crystalline defects in the support materials. These surface imperfections are often surface pits with lateral dimensions and depths between 50 nm to 200 nm.

Although a lower-cost support may have such pit-like surface defects, the final substrate manufactured from such a lower-cost support according to the methods of this invention can nevertheless exhibit only a limited density of bonding defects. The invention also provides low cost engineered substrates having an intermediate layer of amorphous material, for instance, an insulating layer. The methods of the invention can be used with support substrates reclaimed from previous uses in SmartCut™ type processes, support substrates initially manufactured to be of lower quality, or the like.

More precisely, preferred substrates of the invention include a support with a surface having surface pits, an intermediate layer of amorphous material arranged on the surface of the support, a top layer arranged on the intermediate layer, wherein the surface pits are substantially or completely are filled with the amorphous material.

Preferred manufacturing methods of the invention include providing a support having surface pits, depositing an intermediate layer of amorphous material on the pitted surface of the support so as to at least partially fill the pits, annealing the intermediate layer, assembling a donor wafer with the annealed intermediate support to form an intermediate structure, and reducing the thickness of the intermediate structure to form the final substrate.

Methods and substrates of the invention also include providing an amorphous or polycrystalline layer on a support, especially a reclaimed support of reduced thickness.

BRIEF DESCRIPTION OF THE DRAWINGS

Other features and advantages of the invention will become apparent from the following descriptions that refer to the appended drawings, which illustrate exemplary but non-limiting embodiments of the invention, and in which:

FIGS. 4a to 4f illustrate further methods of manufacturing of the invention.

DETAILED DESCRIPTION OF THE PREFERRED EMBODIMENTS

This subsection describes, first, preferred embodiments of engineered substrates, and second, preferred embodiments of methods for their manufacture. The preferred embodiments and particular examples described herein should be seen as examples of the scope of the invention, but not as limiting the present invention. The scope of the present invention should be determined with reference to the claims.

Although most examples are directed to silicon substrates, the invention is not limited to silicon but can be used to manufacture engineered substrates of a wide variety of semiconductor or other materials or stacks thereof. Additionally, the invention can be used with supports or donor substrates in which devices have already been formed.

Support Substrate

Figure 1:
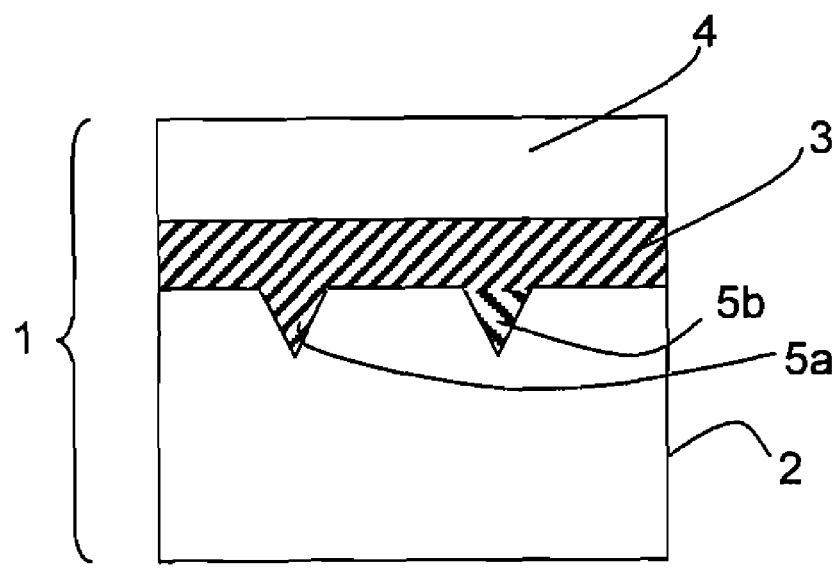
FIG. 1 illustrates substrates of the invention.

FIG. 1 illustrates a preferred embodiment of an engineered substrate of the invention. This illustrated substrate comprises support 2 with surface pits 5a and 5b having typical sizes between about 50 nm and 200 nm in both lateral directions and in depth, intermediate layer 3, and top layer 4. The surface pits illustrated in FIG. 1 are not limiting, and the invention is applicable to supports with greater or lesser numbers and densities of surface pits and to supports with surface pits of greater or lesser sizes.

Support 2 can have surface pits for a variety of reasons. A lower cost support can have been manufactured to have lower quality, possibly with surface pits. For example, such a lower cost support can have been sliced from a Cz silicon ingot, that is an ingot manufactured by the Czochralski method under conditions favouring so called "grown-in" defects such as COPs, oxygen precipitates, dislocation loops, and so forth. The density of defects having a size exceeding, e.g., 10 nm, can be $10^3/cm^3$, or even $10^5/cm^3$. Although these defects are present in the mass of support 2, only those defects that open on the support surface are of concern to the invention and are illustrated in FIG. 1 as pits 5a and 5b.

A lower cost support 2 can also be a wafer that has been reclaimed from several, for instance 5 to 10, uses as a donor wafer in Smart Cut type layer transfer processes. The thermal and chemical treatments during layer transfer, reclaim, and associated processes can lead to development or creation of crystalline defects, e.g., oxygen precipitates, that could open on the surface as pits. Also, reclaimed donor wafer often have reduced thickness. For example, a 200 mm initial silicon donor substrate having a normalised thickness of 675 microns can, when reclaimed, have a thickness below 600 microns, and a 300 mm silicon substrate having a normalised thickness of 750 microns, can, when reclaimed, have a thickness below 700 microns.

Intermediate Layer

Intermediate layer 3 preferably comprises amorphous materials that are selected and deposited to a thickness so as to substantially or completely fill or plug surface pits 5a and 5b. Thereby, final substrates 1 or 11 can have preferred surface defect densities, e.g., less than 1 per $cm^2$, or less than 0.1 per $cm^2$, as observed by SP1. The thickness and material of the intermediate layer can be further adjusted depending on the application of the final substrates 1 or 11.

The intermediate layer can comprise one or more layers of one or more different materials, e.g., silicon nitride, high k dielectric material, low k dielectric material, silicon oxide, and the like. In preferred embodiments, intermediate layer 3 comprises silicon oxides, optionally doped with boron, phosphorus, and the like, and has sufficient viscosity to reflow, either during deposition or during subsequent thermal treatment, so as to substantially or completely fill or plug surface pits 5a and 5b. Preferably, as formed, intermediate layer 3 has a top surface with sufficient smoothness for subsequent processing, e.g., bonding, without any intermediate steps.

Preferred deposition methods can form layers up to several microns thick at low cost. For example, silicon oxides can be deposited by chemical vapour deposition CVD, either at low, atmospheric, or high pressures, and optionally plasma enhanced or photo assisted, and by other suitable deposition methods. Silicon oxides are preferably deposited at low cost and high rate by CVD.

Different applications can require a wide range of intermediate-layer thicknesses, e.g., from 5 to 10 nm up to several microns. CVD is particularly advantageous for those applications, e.g., high power device applications, requiring thick intermediate layers, e.g., 1 micron, or 2 micron, or greater. Thick silicon oxide formed by other means, e.g. by thermal oxidation, can require anneal times of several hours which can incur significant costs.

Top Layer

Top layer 4 is preferably formed to meet requirements of the targeted application. It often comprises mono-crystalline silicon. For high performance applications, e.g., microprocessor unit applications, the top layer can be strained so that carrier mobility's are enhanced, or can have a thickness less than about 100 nm so that devices formed therein can operate in depleted modes. For high power applications, the top layer can have a thickness of about 1 micron, or between about 1 and 5 microns, or between about 2 to 3 microns. For other applications, the top layer can be covered by additional layers of, e.g., silicon, silicon germanium, germanium, silicon carbide, or combinations of these and other materials.

The top layer can also have devices that were already formed in a donor substrate and thereafter transferred onto intermediate layer 3, and can include a stack of layers some or all of which already have such devices.

In preferred embodiments, top layer has a thickness about from, e.g., 10 nm, up to, e.g., 10-50 microns. Thinner top layers of 1 micron and less can be formed by Smart Cut™; thicker top layers of several microns and greater can be formed by bond and etch/grind back or by depositing additional material on a thinner initial top layer.

Further Surface Layers

Figure 2:
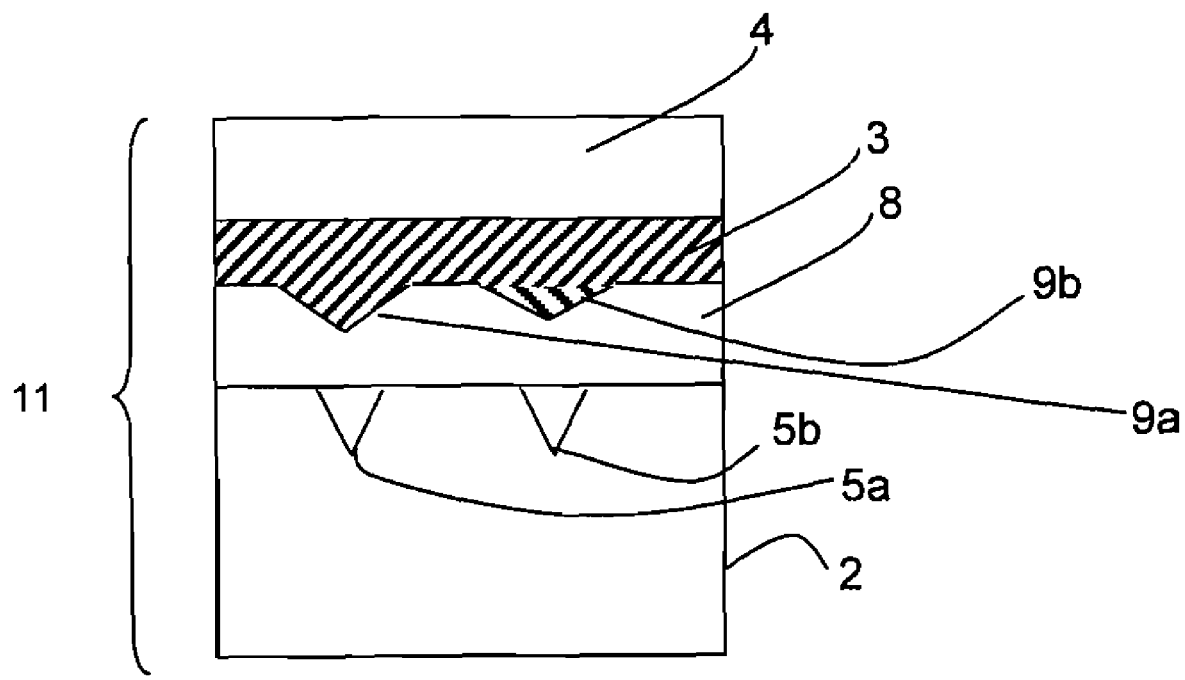
FIG. 2 illustrates further substrates of the invention.

In further embodiments, a surface layer comprising an amorphous or polycrystalline material, e.g., polycrystalline silicon, can be deposited on the support. FIG. 2 illustrates a substrate 11 comprising support 2 on which surface layer 8 has been deposited. Such a surface layer can increase the thickness of support 2, in particular when support 2 is a reclaimed substrate of reduced thickness.

Surface layer 8 also contributes to filling pits 5a and 5b. However, the surface layer may not reflow sufficiently to substantially or completely fill the surface pits leaving exposed pits 9a and 9b that can be of smaller sizes, or comparable sizes, or larger sizes than now buried pits 5a and 5b.

As with substrate 1, substrate 11 of the current embodiment further comprises intermediate layer 3 of amorphous material arranged on surface layer 8, and top layer 4 arranged on intermediate layer 3. Intermediate layer 3 preferably fills surface pits 9a and 9b in surface layer 8 as intermediate layer 3 of the previous embodiment filled surface pits 5a and 5b in support 2. The material and thickness of the amorphous intermediate layer are preferably chosen so that final substrates 1 and 11 have surface defect densities, as observed by SP1, of less than 1 per cm$^2$, and more preferably of less than 0.1 per cm$^2$.

Methods of Manufacture

FIGS. 3a to 3e illustrate a preferred embodiment of methods for manufacturing substrates 1 according to the invention.

Figure 3A:
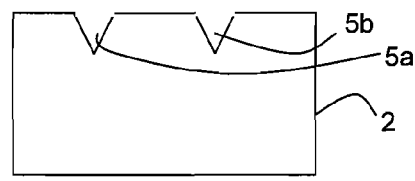
FIGS. 3a to 3e illustrate methods of manufacturing of the invention.

FIG. 3a illustrates support 2 having surface pits 5a and 5b of a size and density that can lead to bonding defects. As explained, support 2 can be a low cost, lower quality, monocrystalline silicon substrate, e.g., having defects greater than about 10 nm at densities greater than approximately $10^3$ defects/cm$^3$ or greater than approximately $10^5$ defects/cm$^3$. Support 2 can also be a wafer that has been previously used and reclaimed, e.g., more than 5 or 10 times, as a donor wafer. Support 2 can also be a polycrystalline substrate.

Figure 3B:
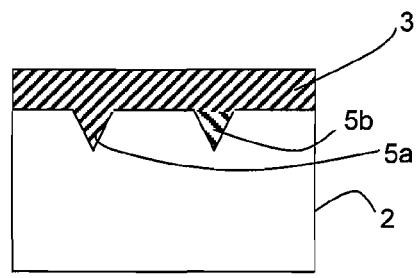

Next, FIG. 3b illustrates that the support is treated to at least partially fill the pits. The intermediate layer 3 comprises an amorphous material that is deposited on support 2 including in surface pits 5a and 5b. Preferred amorphous materials are able to reflow, either on deposition or during a subsequent thermal anneal, so that the surface pits can be substantially or completely filled. Preferred materials are also such that intermediate layer 3, either as deposited or as annealed, has a surface suitable for further processing without any additional preparation, e.g., suitable for assembling and bonding to donor wafer 7 without polishing.

Preferred materials include low k dielectric materials i.e. a material with a dielectric constant that is lower than the dielectric constant of silicon dioxide and high k dielectric materials i.e. a material with a dielectric constant that is higher than the dielectric constant of silicon dioxide. Low k dielectric materials include carbon or fluorine doped silicon dioxide; high k dielectric materials include materials comprising hafnium.

Intermediate layer 3 can also comprise a stack of additional layers of various materials, e.g., a nitride additional layer, or a high k dielectric material additional layer, or a low k dielectric material additional layer. A silicon dioxide layer is preferably formed on top of the additional layer or stack of layers. In such embodiments, at least one of the materials is able to reflow so as to substantially or completely fill surface pits 5a and 5b of support 2, and also the material on the top of the stack is such that its surface after annealing can be ready to be assembled and bonded without further preparation.

In preferred embodiments, intermediate layer 3 comprises silicon dioxide deposited by chemical vapour deposition CVD techniques which can rapidly and cheaply form layers of a wide range of thicknesses. For example, if a final substrate is intended for power device applications, intermediate layer 3 can comprise silicon dioxide with a thickness from 200 nm to 3 microns.

Next, after deposition of amorphous intermediate layer 3, the resulting structure is preferably thermally annealed to allow the deposited amorphous material to reflow into surface pits 5a and 5b, and to insure that surface of the amorphous material is sufficiently planar surface so that it can be assembled to donor substrate 7 without further preparation. Preferably, the resulting structure has few of no bonding defects, either by itself or after assembly into final substrate 1. The anneal can make the deposited material more dense.

Thermal annealing is preferably conducted in a neutral, reducing, or wet atmosphere composed of, e.g., hydrogen, argon, oxygen or a mixture of those elements, at a temperature that exceeds the reflow temperature of the deposited amorphous material, at a pressure above atmospheric, and for a sufficient reflow time. Reflow temperatures are typically in a range from approximately 700° C. to approximately 1100° C.. Reflow times are typically in a range from approximately 30 secs. to approximately several hours, e.g., 2 hours. For instance, CVD-deposited silicon dioxide is preferably annealed at 900° C. for 2 hours.

Annealing can be performed in "Rapid Thermal Anneal RTA" equipment for a duration of about 30 seconds to 3 minutes. Temperature ramp up and ramp down in such annealing equipment can reach rates of 10° C./s to 50° C./s or even more.

Annealing can also be performed in a "batch annealing" oven for a duration, between boat-in and boat-out, of approximately 30 min to approximately several hours. The temperature ramp up and down during batch annealing is more modest, often approximately only several degrees per minute.

Figure 3C:
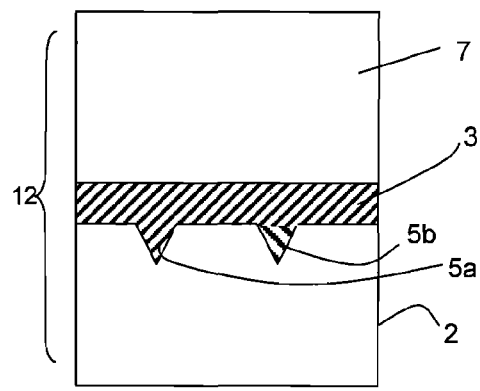
Figure 3D:
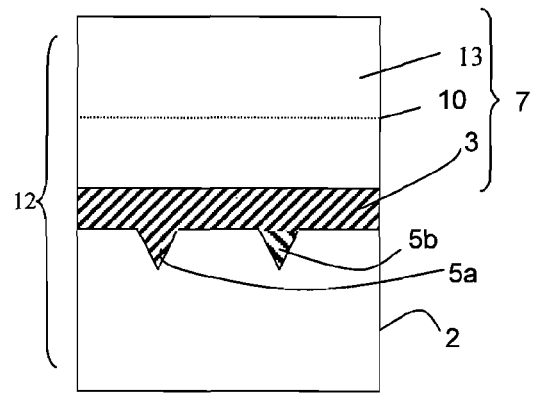

Next, FIGS. 3c and 3d illustrate that support 2 with intermediate layer 3 is assembled by bonding to donor substrate 7 to form intermediate structure 12. Reflow of the amorphous material of intermediate layer 3 during annealing has preferably substantially or completely filled the surface pits of support 2. Reflow has also preferably substantially planarized and activated the surface of intermediate layer 3 so that a quality bond with few of no defects can be achieved by simply bringing the surface of intermediate layer 3 and the surface of donor substrate 7 into close contact. Optionally, bonding can be facilitated by modest pressure and/or heat treatment, or by depositing an insulating layer, or, in case of a silicon donor wafer, by thermally oxidizing donor substrate 7, or by briefly polishing intermediate layer 3.

After assembling, the thickness of the top layer can be optionally increased.

After bonding, the back surface of donor wafer 7 is thinned by known thinning techniques such as grinding/polishing/etching methods, or Smart Cut™, or other known thinning techniques.

FIG. 3c further illustrates thinning the back surface of donor wafer 7 by grinding/polishing/etching methods. Specifically, bond and etch/grind back is preferred to remove a selected thickness of donor wafer 7. If donor wafer 7 comprises an SOI wafer, the insulator layer buried within can serve as an etch stop.

FIG. 3d further illustrates thinning the back surface of donor wafer 7 by Smart Cut. According to Smart Cut™ methods, before bonding, light ions are implanted to a selected depth in donor wafer 7 in order to form plane of weakness 10 which defines the thickness of material to be removed. After bonding, the portion of the donor substrate defined by plane of weakness 10 is removed 'en bloc' by providing sufficient energy to induce fracture of the donor wafer at the plane of weakness.

Figure 3E:
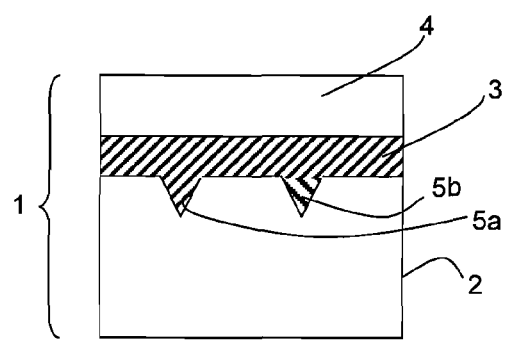

FIG. 3e illustrates final substrate 1.

FIGS. 4a to 4f illustrate another preferred embodiment for manufacturing substrates 11 according to the invention.

FIG. 4a illustrates initial support 2 with surface pits 5a and 5b.

Next, FIG. 4b illustrates a first step in which surface layer 8 of amorphous or polycrystalline material is deposited or otherwise placed on initial support 2. If support 2 is a reclaimed substrate that is likely to have a reduced thickness, this step is particularly advantageous to insure that support 2 has a thickness comparable with thicknesses standard in the industry.

If the material of surface layer 8 does not have reflow properties that are sufficient to substantially or completely fill pits 5a and 5b, surface layer 8 itself can present pits 9a and 9b which can be of the same or different sizes than original pits 5a and 5b in support 2.

Next, FIG. 4c illustrates that, similarly to the embodiment of FIGS. 3a-e, intermediate layer 3 of additional material is provided by deposition, oxidation, or the like. Subsequent annealing of the surface of surface layer 8 can substantially or completely fill pits 9a and 9b and can a surface that is ready for bonding to a donor substrate. Preferably further preparation of the surface of intermediate layer 3 is not necessary, but optionally, modest polishing can be performed to better planarize and activate this surface.

Figure 4F:
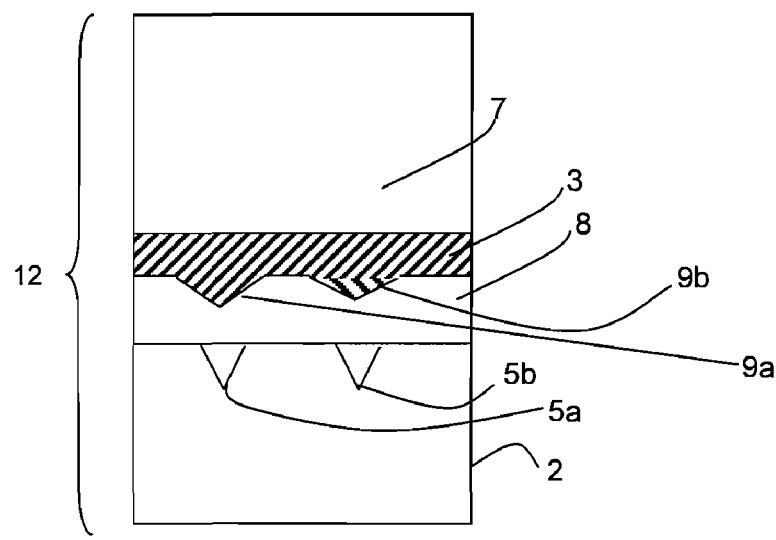
Figure 4F:
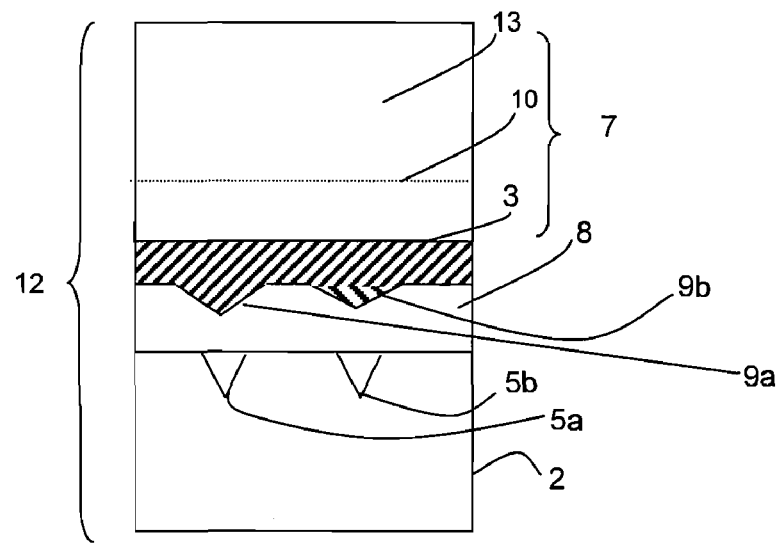
Figure 4F:
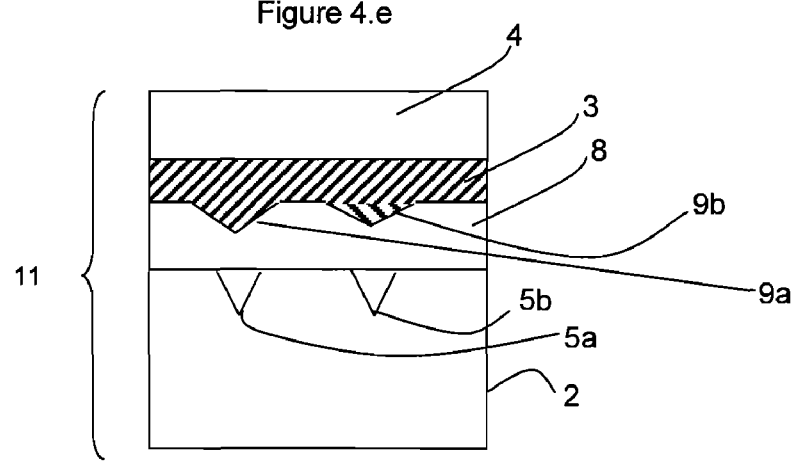

Next, FIGS. 4d-f illustrate steps which are similar to the steps illustrated in FIGS. 3c-e. Briefly, donor substrate 7 is bonded to intermediate layer 3, and then the thickness of the donor wafer is reduced using known techniques e.g., bond and etch/grind back (FIG. 4d) or Smart Cut™ (FIG. 4e) to form final substrate structure 11 (FIG. 4f).

What is claimed is:

1. A substrate comprising:
   a support that includes surface pits of lateral and vertical dimensions both of which are between approximately 50 nm and the approximately 200 nm;
   an intermediate layer comprising an amorphous material arranged on the surface of the support so as to at least partially or completely fill the surface pits; and
   a top layer arranged on the intermediate layer,
   wherein the support and the top layer each comprises mono-crystalline silicon.

2. The substrate of claim 1, wherein the top layer has a thickness that is between approximately 1 and 5 microns.

3. The substrate of claim 1, wherein the support has a density of defects of a size of at least approximately 10 nm that is greater than approximately $10^3$ /cm$^3$.

4. The substrate of claim 1, wherein the intermediate layer comprises silicon dioxide.

5. The substrate of claim 4, wherein the intermediate layer has a thickness that is between approximately 200 nm and approximately 3 microns.

6. The substrate of claim 1, wherein the intermediate layer comprises one or more of silicon nitride, a high k dielectric material, a low k dielectric material, and silicon oxide.

7. The substrate of claim 1, wherein bonding defects between layers are present at a density of less than 1/cm$^2$.

8. A substrate comprising:
   a support that includes surface pits of lateral and vertical dimensions both of which are between approximately 50 nm and the approximately 200 nm;
   an intermediate layer comprising an amorphous material arranged on the surface of the support so as to at least partially or completely fill the surface pits; and
   a top layer arranged on the intermediate layer,
   wherein the support is a substrate comprising semiconductor material which support has been reclaimed after a prior use in a layer transfer process which causes the surface pits and
   wherein the surface pits are completely filled by the amorphous material of the intermediate layer.

9. The substrate of claim 8, wherein the support comprises a mono-crystalline silicon wafer with a diameter of approximately 200 mm and a thickness of less than approximately 600 microns.

10. The substrate of claim 8, wherein the support comprises a mono-crystalline silicon wafer with a diameter of approximately 300 mm and a thickness of less than approximately 700 microns.

11. The substrate of claim 8, wherein the support comprises an amorphous or polycrystalline surface layer having surface pits.

12. A method of manufacturing a substrate comprising:
    treating a support comprising mono-crystalline silicon having surface pits of lateral and vertical dimensions, both of which are between approximately 50 nm and approximately 200 nm, by depositing an intermediate layer comprising an amorphous material on the surface of the support so as to at least partially or completely fill the pits;
    annealing the intermediate layer;
    assembling a donor substrate with the annealed intermediate layer to form an intermediate structure; and
    reducing the thickness of the donor substrate portion of the intermediate structure to form the substrate.

13. The method of claim 12, wherein the amorphous material comprises silicon dioxide, and the depositing comprises chemical vapor deposition.

14. The method of claim 12, wherein annealing the intermediate layer comprises exposure to a reducing, neutral or wet atmosphere at a temperature between approximately 700° C. to 1100° C. for of 30 seconds to several hours.

15. The method of claim 14, wherein annealing the intermediate layer comprises wet oxidation at approximately 900° C. for approximately 2 hours such that all pits are completely filled by the amorphous material of the intermediate layer.

16. The method of claim 12, wherein reducing thickness of the donor substrate portion of the intermediate structure comprises back side grinding or etching.

17. The method of claim 12, further comprising, prior to assembling, forming a plane of weakness in the donor substrate, the plane of weakness defining a part of the donor substrate to be removed after assembly; and wherein reducing thickness of the donor substrate further comprises detaching the part of the donor substrate to be removed at the plane of weakness.

18. The method of claim 12, further comprising, prior to assembling, polishing the intermediate layer to facilitate molecular bonding.

19. A method of manufacturing a substrate comprising:
    providing a support from a reclaimed substrate comprising semiconductor material that has been subjected to a layer transfer process which causes surface pits of lateral and vertical dimensions, wherein both pits have dimensions of between approximately 50 nm and approximately 200 nm,
    treating the surface pits of the support by depositing an intermediate layer comprising an amorphous material on the surface of the support so as to at least partially or completely fill the pits;
    annealing the intermediate layer;
    assembling a donor substrate with the annealed intermediate layer to form an intermediate structure; and
    reducing the thickness of the donor substrate portion of the intermediate structure to form the substrate.

* * * * *

UNITED STATES PATENT AND TRADEMARK OFFICE
CERTIFICATE OF CORRECTION

| | | |
|---|---|---|
| PATENT NO. | : 8,013,417 B2 | Page 1 of 1 |
| APPLICATION NO. | : 12/469436 | |
| DATED | : September 6, 2011 | |
| INVENTOR(S) | : Nguyen et al. | |

It is certified that error appears in the above-identified patent and that said Letters Patent is hereby corrected as shown below:

Title Page:
Item (73) Assignee, change "S.O.I.T.ec" to -- S.O.I.Tec --.
Assignee's name will then correctly appear as "S.O.I.Tec Silicon on Insulator Technologies".

Signed and Sealed this
Twenty-fifth Day of October, 2011

David J. Kappos
*Director of the United States Patent and Trademark Office*